United States Patent
Smart et al.

(10) Patent No.: US 7,968,391 B1
(45) Date of Patent: *Jun. 28, 2011

(54) HIGH VOLTAGE GAN-BASED TRANSISTOR STRUCTURE

(75) Inventors: Joseph Smart, Mooresville, NC (US); Brook Hosse, Huntersville, NC (US); Shawn Gibb, Charlotte, NC (US); David Grider, Huntersville, NC (US); Jeffrey B. Shealy, Huntersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 40 days.

This patent is subject to a terminal disclaimer.

(21) Appl. No.: 11/937,207

(22) Filed: Nov. 8, 2007

Related U.S. Application Data

(62) Division of application No. 11/360,734, filed on Feb. 23, 2006, now Pat. No. 7,459,356, which is a division of application No. 10/689,979, filed on Oct. 20, 2003, now Pat. No. 7,026,665.

(60) Provisional application No. 60/503,972, filed on Sep. 19, 2003.

(51) Int. Cl.
    *H01L 21/338* (2006.01)
(52) U.S. Cl. .......... 438/172; 438/167; 438/194; 438/47; 257/194
(58) Field of Classification Search .............. 438/172, 438/167, 194, 47; 257/194, 183, E29.25, 257/E29.246, E29.247, E29.248
    See application file for complete search history.

(56) References Cited

U.S. PATENT DOCUMENTS

| | | | |
|---|---|---|---|
| 5,608,353 A | 3/1997 | Pratt | |
| 5,629,648 A | 5/1997 | Pratt | |
| 6,064,082 A | 5/2000 | Kawai et al. | |
| 6,130,579 A | 10/2000 | Iyer et al. | |
| 6,177,685 B1 * | 1/2001 | Teraguchi et al. | 257/20 |
| 6,191,656 B1 | 2/2001 | Nadler | |
| 6,229,395 B1 | 5/2001 | Kay | |
| 6,265,943 B1 | 7/2001 | Dening et al. | |
| 6,271,727 B1 | 8/2001 | Schmukler | |
| 6,285,239 B1 | 9/2001 | Iyer et al. | |
| 6,307,364 B1 | 10/2001 | Augustine | |
| 6,313,705 B1 | 11/2001 | Dening et al. | |
| 6,329,809 B1 | 12/2001 | Dening et al. | |
| 6,333,677 B1 | 12/2001 | Dening | |
| 6,356,150 B1 | 3/2002 | Spears et al. | |
| 6,369,656 B2 | 4/2002 | Dening et al. | |
| 6,369,657 B2 | 4/2002 | Dening et al. | |
| 6,384,433 B1 | 5/2002 | Barratt et al. | |
| 6,392,487 B1 | 5/2002 | Alexanian | |
| 6,404,287 B2 | 6/2002 | Dening et al. | |
| 6,521,998 B1 | 2/2003 | Teraguchi et al. | |
| 6,525,611 B1 | 2/2003 | Dening et al. | |
| 6,528,983 B1 | 3/2003 | Augustine | |
| 6,560,452 B1 | 5/2003 | Shealy | |
| 6,566,963 B1 | 5/2003 | Yan et al. | |
| 6,624,452 B2 * | 9/2003 | Yu et al. | 257/194 |

(Continued)

*Primary Examiner* — Theresa T Doan
(74) *Attorney, Agent, or Firm* — Withrow & Terranova, P.L.L.C.

(57) ABSTRACT

A high voltage and high power gallium nitride (GaN) transistor structure is disclosed. A plurality of structural epitaxial layers including a GaN buffer layer is deposited on a substrate. A GaN termination layer is deposited on the plurality of structural epitaxial layers. The GaN termination layer is adapted to protect the plurality of structural epitaxial layers from surface reactions. The GaN termination layer is sufficiently thin to allow electrons to tunnel through the GaN termination layer. Electrical contacts are deposited on the GaN termination layer, thereby forming a high electron mobility transistor.

11 Claims, 2 Drawing Sheets

U.S. PATENT DOCUMENTS

Figure 1:
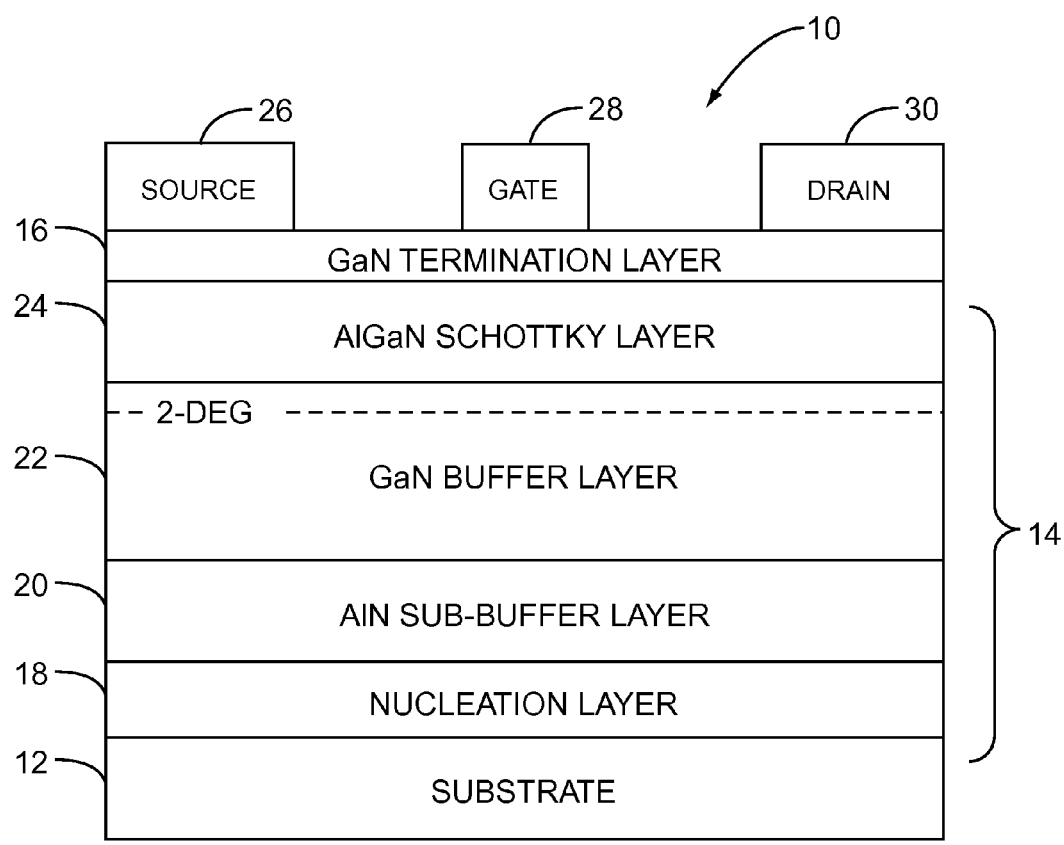

| | | |
|---|---|---|
| 6,701,134 B1 | 3/2004 | Epperson |
| 6,701,138 B2 | 3/2004 | Epperson et al. |
| 6,720,831 B2 | 4/2004 | Dening et al. |
| 6,724,252 B2 | 4/2004 | Ngo et al. |
| 6,750,482 B2 | 6/2004 | Seaford et al. |
| 7,026,665 B1 * | 4/2006 | Smart et al. .................. 257/190 |
| 7,459,356 B1 * | 12/2008 | Smart et al. .................. 438/172 |
| 2003/0218183 A1 | 11/2003 | Micovic et al. |

* cited by examiner

HIGH VOLTAGE GAN-BASED TRANSISTOR STRUCTURE

This application is a Divisional of U.S. patent application Ser. No. 11/360,734 filed Feb. 23, 2006, currently pending, which is a Divisional of U.S. patent application Ser. No. 10/689,979 filed Oct. 20, 2003, issued on Apr. 11, 2006 as U.S. Pat. No. 7,026,665, which claims the benefit of provisional patent application Ser. No. 60/503,972, filed Sep. 19, 2003. The disclosures of the above are hereby incorporated by reference in their entireties.

FIELD OF THE INVENTION

The present invention relates to a high voltage transistor heterostructure, and more particularly relates to a high voltage gallium nitride (GaN) high electron mobility transistor (HEMT).

BACKGROUND OF THE INVENTION

Gallium nitride (GaN) offers substantial opportunity to enhance performance of electronic devices such as high electron mobility transistors (HEMTs). In general, a GaN HEMT has a Schottky layer and a GaN buffer layer deposited on a substrate and source, gate, and drain contacts deposited on the Schottky layer. However, during high voltage/power operation, electrons may gain enough kinetic energy to be injected into the substrate, thereby degrading the performance of the HEMT.

In addition, the Schottky layer is typically metallic and may be exposed to air during fabrication of the HEMT and/or during operation of the HEMT. By exposing the Schottky layer to air, surface reactions such as oxidation may occur on the surface of the Schottky layer. These surface reactions may degrade the performance of the HEMT and also decrease the effectiveness of passivation. Passivation is the deposition of a dielectric material on the surface of the HEMT in order to passivate, or fill, surface traps on the surface of the HEMT, thereby avoiding device degradation due to these surface traps such as RF to DC dispersion.

Therefore, there remains a need for a high voltage GaN HEMT structure. In addition, there remains a need for a GaN HEMT having a reproducible termination layer capable of preventing surface reactions during fabrication and operation of the GaN HEMT.

SUMMARY OF THE INVENTION

The present invention relates to a high voltage and high power gallium nitride (GaN) transistor structure. In general, the GaN transistor structure includes a sub-buffer layer that serves to prevent injection of electrons into a substrate during high voltage operation, thereby improving performance of the GaN transistor during high voltage operation. Preferably, the sub-buffer layer is aluminum nitride, and the GaN transistor structure further includes a transitional layer, a GaN buffer layer, and an aluminum gallium nitride Schottky layer.

The GaN transistor structure may include a GaN termination layer deposited on the Schottky layer. The GaN termination layer may be implemented separately or in combination with the sub-buffer layer. The GaN termination layer serves to protect the Schottky layer from surface reactions, such as oxidation, during fabrication and device operation. In addition, the GaN termination layer serves as a reproducible termination layer, thereby increasing the effectiveness of passivation of surface traps on the surface of the GaN transistor heterostructure.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 2:
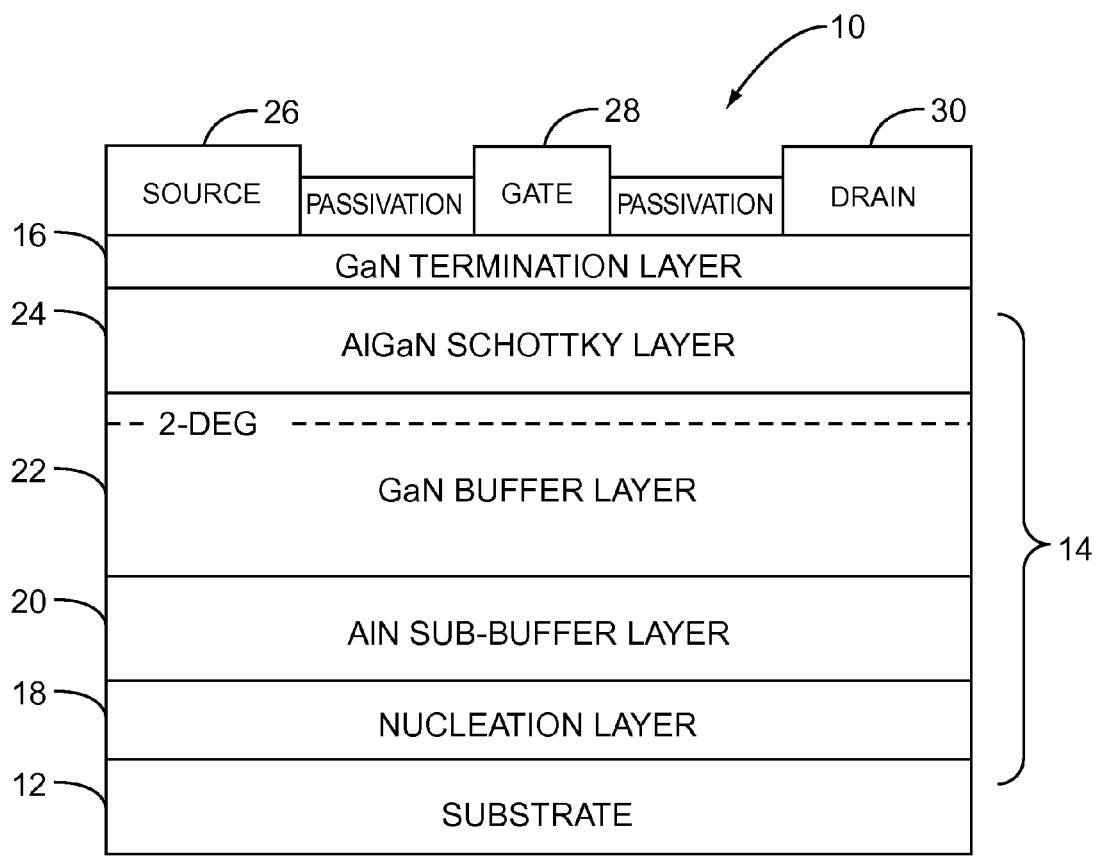

FIG. 1 illustrates a high voltage gallium nitride (GaN) high electron mobility transistor (HEMT) according to one embodiment of the present invention; and FIG. 2 illustrates the GaN HEMT of FIG. 1 after passivation.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a high voltage gallium nitride (GaN) transistor structure preferably incorporated in a high electron mobility transistor (HEMT) 10 as illustrated in FIG. 1. The HEMT 10 includes a substrate 12, structural epitaxial layers 14, and a GaN termination layer 16. The structural epitaxial layers 14 include a nucleation (transitional) layer 18, an aluminum nitride (AlN) sub-buffer layer 20, a GaN buffer layer 22, and an aluminum gallium nitride ($Al_xGa_{1-x}N$; $0<x<1$) Schottky layer 24. Further, the HEMT 10 includes source contact 26, gate contact 28, and drain contact 30. Although the AlN sub-buffer 20 and the GaN termination layer 16 are described herein as being part of the HEMT 10, it is important to note that additional embodiments of the present invention may have either the AlN sub-buffer layer 20 or the GaN termination layer 16 instead of having both of these layers 20 and 16.

During high voltage or high power operation of the HEMT 10, electrons in a two dimensional electron gas (2-DEG) conduction channel may gain enough kinetic energy to be injected into the AlN sub-buffer layer 20. The AlN sub-buffer layer 20 prevents injection of the electrons into the nucleation layer 18 and the substrate 12 during high voltage/power operation of the HEMT 10, thereby improving the performance of the HEMT 10. As a result of the AlN sub-buffer layer 20, a source-drain breakdown voltage for the HEMT 10 improves from approximately 20 volts to 100 volts, and the output power of the HEMT 10 is significantly improved. Therefore, the HEMT 10 may be used in high power GaN devices such as but not limited to a high power GaN amplifier (not shown).

The GaN termination layer 16 serves to protect the $Al_xGa_{1-x}N$ Schottky layer 24 from surface reactions, such as oxidation, during fabrication and operation of the HEMT 10. Because the Schottky layer 24 includes aluminum, oxidation occurs if the $Al_xGa_{1-x}N$ Schottky layer 24 is exposed to air. The GaN termination layer 16 serves to prevent the oxidation of the $Al_xGa_{1-x}N$ Schottky layer 24. Also, the source contact 26 and the drain contact 30, which are ohmic contacts, are more easily formed on the GaN termination layer 16 than the $Al_xGa_{1-x}N$ Schottky layer 24.

In the preferred embodiment, the GaN termination layer 16 is approximately 1-2 nanometers thick. Therefore, electrons can easily tunnel through the GaN termination layer 16. Tunneling is a quantum-mechanical phenomenon where electrons can pass through a potential energy barrier greater than the kinetic energy of the electrons. As a result, the GaN termination layer 16 does not increase the Schottky barrier height between the gate contact 28 and the $Al_xGa_{1-x}N$ Schottky layer 24, where the Schottky barrier height defines a potential energy barrier encountered by electrons at the interface of the gate contact 28 and the $Al_xGa_{1-x}N$ Schottky layer 24. Further, the GaN termination layer 16 does not affect the formation of the source and drain contacts 26 and 30.

The substrate 12 may include various materials including but not limited to sapphire or silicon carbide (SiC). The nucleation layer 18 is preferably an aluminum rich layer such as but not limited to $Al_xGa_{1-x}N$, where X is in the range 0 to 1. In addition, the structural epitaxial layers 14 and the GaN termination layer 16 may be grown in a growth chamber (not shown) by various methods including Flow Modulation Organometallic Vapor Phase Epitaxy (FM-OMVPE), Organometallic Vapor-Phase Epitaxy (OMVPE), Molecular Beam Epitaxy (MBE), Hydride Vapor-Phase Epitaxy (HVPE), and Physical Vapor Deposition (PVD).

To begin the growth of the structural epitaxial layers 14 and the GaN termination layer 16 on the substrate 12, the nucleation layer 18 is deposited on the substrate 12. The nucleation layer 18 operates to correct a lattice mismatch between the AlN sub-buffer layer 20 and the substrate 12. In general, a lattice mismatch is created when spacing between atoms of one layer does not match spacing between the atoms of an adjacent layer. As a result of the lattice mismatch, bonding between the atoms of the adjacent layers are weak, and the adjacent layers could crack, separate, or have a large number of crystalline defects. Therefore, the nucleation layer 18 operates to correct the lattice mismatch between the AlN sub-buffer layer 20 and the substrate 12 by creating an interface between the crystalline structure of the substrate 12 and the crystalline structure of the AlN sub-buffer 20.

After depositing the nucleation layer 18, the AlN sub-buffer layer 20 is deposited on the nucleation layer 18. As discussed above, the AlN sub-buffer layer 20 serves to improve the performance of the HEMT 10 during high voltage/power operation. Once the AlN sub-buffer layer 20 is deposited on the nucleation layer 18, the GaN buffer layer 22 is deposited on the AlN sub-buffer layer 20, and the $Al_xGa_{1-x}N$ Schottky layer 24 is deposited on the GaN buffer layer 22. The 2-DEG conduction channel, which is a thin, high mobility channel, confines carriers to an interface region illustrated by a dashed line between the GaN buffer layer 22 and the $Al_xGa_{1-x}N$ Schottky layer 24. The GaN termination layer 16 is deposited on the $Al_xGa_{1-x}N$ Schottky layer 24 and serves to protect the $Al_xGa_{1-x}N$ Schottky layer 24 from surface reactions, such as oxidation, during fabrication and operation of the HEMT 10.

After growth of the structural epitaxial layers 14 and the GaN termination layer 16 on the substrate 12, the HEMT 10 is fabricated by depositing the source, gate, and drain contacts 26, 28, and 30, respectively, on the GaN termination layer 16. Each of the contacts 26, 28, and 30 are metallic contacts. Preferably, the gate contact 28 is a metallic material such as but not limited to nickel gold, and the source and drain contacts 26 and 30, respectively, are each a metallic material such as but not limited to titanium, gold, or aluminum.

FIG. 2 illustrates another embodiment of the HEMT 10. In this embodiment, the GaN termination layer 16 further serves as a reproducible termination layer for the passivated HEMT 10. By being reproducible, the GaN termination layer 16 may be consistently reproduced each time the HEMT 10 is fabricated. In this embodiment, the HEMT 10 includes a passivation layer 32 deposited on the GaN termination layer 16. In general, the passivation layer 32 is a dielectric material that passivates, or fills, surface traps on the surface of the GaN termination layer 16, where surface traps are unfilled bonding sites in the crystalline structure due to abrupt termination of the GaN termination layer 16. The passivation layer 32 is deposited on the GaN termination layer 16 before forming the contacts 26, 28, and 30. Regions of the passivation layer 32 are etched, and the contacts 26, 28, and 30 are formed in the etched regions such that the passivation layer 32 remains between the source contact 26 and the gate contact 28 and between the gate contact 28 and the drain contact 30. One example of a passivated HEMT is disclosed in commonly owned and assigned U.S. Pat. No. 7,052,942 which is incorporated herein by reference in its entirety.

Those skilled in the art will recognize improvements and modifications to the preferred embodiments of the present invention. All such improvements and modifications are considered within the scope of the concepts disclosed herein and the claims that follow.

What is claimed is:

1. A gallium nitride (GaN) transistor structure comprising:
   a) a plurality of structural epitaxial layers including a GaN buffer layer above a substrate and an aluminum gallium nitride Schottky layer above the GaN buffer layer;
   b) a GaN termination layer consisting essentially of GaN and containing essentially no aluminum over the aluminum gallium nitride Schottky layer, the GaN termination layer adapted to protect the aluminum gallium nitride Schottky layer from oxidation of aluminum gallium nitride in the aluminum gallium nitride Schottky layer; and
   c) electrical contacts on the GaN termination layer, thereby forming a high electron mobility transistor.

2. The GaN transistor structure of claim 1 wherein the GaN termination layer is sufficiently thin to allow electrons to tunnel through the GaN termination layer.

3. The GaN transistor structure of claim 1 wherein the GaN termination layer is approximately 1-2 nanometers (nm) thick.

4. The GaN transistor structure of claim 1 wherein the GaN termination layer comprises a reproducible termination layer, thereby increasing effectiveness of passivation.

5. The GaN transistor structure of claim 1 wherein the plurality of structural epitaxial layers further comprises a transitional layer above the substrate.

6. The GaN transistor structure of claim 5 wherein the GaN buffer layer is above the transitional layer.

7. The GaN transistor structure of claim 6 wherein the GaN transistor structure is a high voltage GaN transistor structure.

8. The GaN transistor structure of claim 7 wherein the plurality of structural epitaxial layers further comprises an aluminum nitride (AlN) sub-buffer layer above the transitional layer, such that the GaN buffer layer is above the AlN sub-buffer layer and the AlN sub-buffer layer is adapted to increase a source-drain breakdown voltage of the high voltage GaN transistor structure by preventing electrons from entering the transitional layer and the substrate during high voltage operation.

9. The GaN transistor structure of claim 1 wherein the electrical contacts comprise a source contact, a gate contact, and a drain contact, and wherein the source contact, gate contact, and drain contact are metallic.

10. The GaN transistor structure of claim 1 wherein the GaN termination layer is directly over the aluminum gallium nitride Schottky layer.

11. The GaN transistor structure of claim 10 wherein the aluminum gallium nitride Schottky layer is directly above the GaN buffer layer.

* * * * *